Sept. 30, 1969 HUNG CHANG LIN 3,470,390

INTEGRATED BACK-TO-BACK DIODES TO PREVENT
BREAKDOWN OF MIS GATE DIELECTRIC

Filed Feb. 2, 1968

WITNESSES:

*Leon M. Garman*

*James F. Young*

INVENTOR

Hung Chang Lin

BY *Gordon H Telfer*

ATTORNEY 3,470,390

INTEGRATED BACK-TO-BACK DIODES TO PREVENT BREAKDOWN OF MIS GATE DIELECTRIC

Hung Chang Lin, Silver Spring, Md., assignor to Westinghouse Electric Corporation, Pittsburgh, Pa., a corporation of Pennsylvania Filed Feb. 2, 1968, Ser. No. 702,721
Int. Cl. H03k 5/08
U.S. Cl. 307—237 4 Claims

ABSTRACT OF THE DISCLOSURE

Voltages applied to the gate electrode of an MIS device are prevented from breaking down the dielectric under the electrode by being clamped to a safe level by means of a protective element that may be within the same body of semiconductive material characterized by having a pair of back-to-back PN junction diodes connected to the gate electrode.

BACKGROUND OF THE INVENTION

Field of the invention

This invention relates generally to semiconductor devices of the MIS type where MIS refers to metal-insulator-semiconductor. Such devices are generally known and commonly include as the insulator a layer of silicon oxide (MOS) or silicon nitride (MNS) but may include other insulators.

Description of the prior art

MIS transistors are known that are subject to permanent damage by reason of voltages applied to the gate electrode exceeding the breakdown voltage of the dielectric layer under it. The problem is aggravated by the fact that it is desirable for the dielectric layer to be thin so that the gate can effectively modulate the resistance of the channel region in the semiconductive material over which it is disposed. One type of possible protection from such dielectric breakdown is to use a Zener diode connected to the gate electrode but this however is effective only for signals of a single polarity. For opposite polarity signals, such a diode may clamp the signal to a very low value (the diode forward drop) unsuitable for operation. Another method is that disclosed by Van Beek in copending application Ser. No. 581,580, filed Sept. 23, 1966, and assigned to the assignee of the present invention. It should be referred to for further description of breakdown problems and their solution through the use of a protective element exhibiting a punch-through action. Since this scheme requires a space charge region it is also only applicable to signals of a single polarity.

Another problem relating to MIS devices is that encountered when the devices are operated in a circuit requiring high input impedance at the gate electrode. Means has to be provided to furnish the proper bias potential level on the gate without lowering the input impedance.

Therefore, among the deficiencies of the prior art over which the present invention provides improvement is the inability to provide protection against excessive voltage surges of either polarity while at the same time providing biasing for high input impedance operation.

SUMMARY OF THE INVENTION

This invention improves over the prior art, including the above-mentioned problems, by providing a structure including an MIS transistor element of generally known type including an insulating layer subject to voltage breakdown and also including a protective element, within the same body, electrically coupled to the gate electrode and characterized by having a pair of back to back P-N junction diodes that clamp any applied signal, regardless of polarity, that appears at the input to a value below that voltage which causes dielectric breakdown. In its preferred form the protective element includes a structure generally corresponding to that of the MIS transistor but having between the source and drain regions and in P-N junction relation with them an additional region of material of opposite conductivity type to that of the source and drain regions that is more highly doped than the underlying material. One of the source and drain regions of the protective element is connected to the gate electrode so that input signals see the source and drain regions and the additional regions as a pair of back-to-back diodes providing effective clamping action for signals of either polarity. Biasing for high input impedance operation is conveniently provided by coupling the source of biasing potential to the other of the source and drain regions of the protective element that is not connected to the gate electrode. Fabrication simplicity is preserved by the corresponding relation between the regions of the protective element and those of the MIS transistor. The additional region between the source and drain of the protective element can be provided simultaneously with a guard ring region in the MIS transistor that surrounds the source and drain in a known manner to reduce leakage therebetween. The protective element may utilize a gate electrode although such electrode is not essential.

DESCRIPTION OF THE PREFERRED EMBODIMENTS

Figure 1:
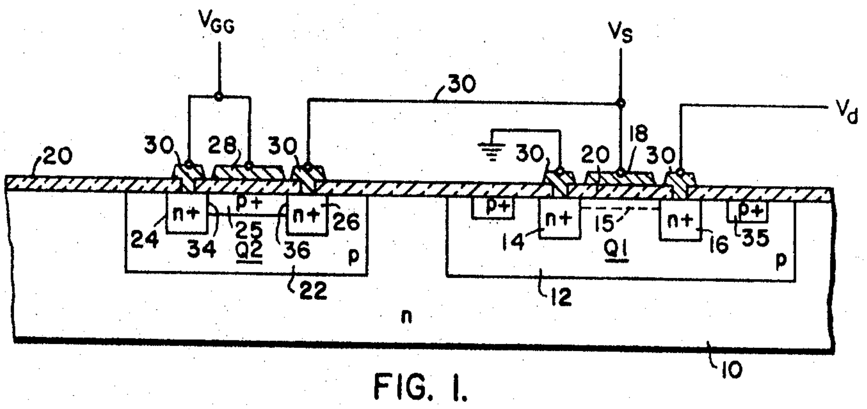
FIGURE 1 is a partial sectional view of a semiconductor device embodying the present invention with schematically illustrated circuit connections.

Referring to FIGURE 1, a semiconductor structure is shown including a substrate 10 of one conductivity type, here N type, in which first and second regions 12 and 22 of opposite type (p-type) are disposed. In one of the p-type regions 12 an MIS transistor is contained including n+ source and drain regions 14 and 16 that define a channel region 15 therebetween at the surface of the first p-type region 12. An insulating layer 20 at least covers that portion of the surface over the channel region 15 and has on it a gate electrode 18. The insulating layer 20 is subject to voltage breakdown and permanent damage upon application of voltage signals $V_S$ to the gate electrode 18 of a magnitude greater than the breakdown voltage $V_B$ of the insulating layer.

In the second p-type region 22 a structure similar to that in the first p-type region 12 is contained including second source and drain regions 24 and 26 but having between them an additional region 25 of p+ material forming with the source and drain a pair of P-N junctions 34 and 36, respectively.

The right-hand element of the structure is an active MIS transistor designated Q1 while the left-hand element is a protective element in accordance with this invention designated Q2. The source and drain 24 and 26 and the additional p+ region 34 or Q2 effectively provide a pair of back to back diodes having a breakdown voltage to any polarity input signal; the diode breakdown voltage is of a lower magnitude than $V_B$. By coupling one of the source and drain regions, here region 26, of Q2 to the gate electrode 18 by means of conductor 30, Q2 clamps any applied signal to the gate electrode 18 to a value below $V_B$.

It is significant for convenient fabrication of the structure that Q1 and Q2 are formed by essentially similar regions. The first and second p-type regions 12 and 22 are alike in thickness and impurity concentration profile. The source and drain regions 14, 16, 24, and 26 of both Q1 and Q2 are alike in thickness and impurity concentration profile. Also the additional p+ region 25 and a guard ring region 35 in Q1 are alike in thickness and impurity concentration profile so that it is seen that the structure is directly amenable to simultaneous fabrication techniques as are employed in conventional integrated circuit production. The guard ring 35 is an optional feature to minimize leakage currents between the source and drain 14 and 16 of Q1 and is provided in accordance with the teachings of Lin and Shiota in copending application Ser. No. 562,591, filed July 5, 1966, and assigned to the assignee of the present invention, which should be referred to for further description of such guard rings, their formation and use. The guard ring 35 surrounds the source and drain regions 14 and 16 and has projections (not shown) extending in but not across the channel region 15 on both sides of the source to drain path..

As is preferred, insulating layer 20 is shown over the entire surface except where the source and drain contacts 30 extend through to the semiconductive material. While illustrated for convenience as a layer of uniform thickness, it is commonly the case to provide lesser thickness of the insulating layer 20 under the gate electrode 18 for more sensitive control of the resistance of the underlying channel region 15. The insulating layer 20 may be of silicon dioxide as is commonly used in surface passivated structures formed by thermal or pyrolytic oxidation.

By way of more particular example as to the semiconductive structure and its method of fabrication, one may begin with a slice of n-type silicon doped with an impurity such as antimony to a resistivity of about 25 ohm-centimeters. On a surface of the slice a p-type epitaxial layer is grown employing one of the known reactions for thermal decomposition of a silicon compound with the inclusion of a gaseous source of p-type impurities, such as diborane, which layer is grown to a thickness of about 10 microns and a resistivity of about 5 ohm-centimeters. Subsequently, by diffusion selectively through the epitaxial layer with a donor impurity such as phosphors to the original slice, walls to isolate portions of the structure in which Q1 and Q2 are contained are formed so that such isolation walls and the starting material provide the illustrated n-type substrate 10 while the portions of the p-type epitaxial layer remaining provide the first and second p-type regions 12 and 22. Then the source and drain regions 14, 16, 24 and 26 may be formed in a single selective diffusion operation to a thickness of about 1 micron and a surface concentration of about $10^{20}$ atoms per cubic centimeter while the P+ region 25 in Q2 and the guard ring, if used, in Q1 may be formed in a single selective diffusion operation to a thickness of about 1 micron and a surface concentration of about $10^{19}$ atoms per cubic centimeter. The source and drain contacts 30 and gate electrodes 18 and 28 plus any conductive interconnections extending over the oxide layer surface may be formed by conventional metallization and photolithographic techniques.

As is usual a current generating potential source, represented by $V_d$, is applied across the drain and source electrodes 30 of Q1, the source 14 being shown as grounded. The gate of Q1 is connected to the drain 26 to Q2 while the source 24 and gate electrode 28 of Q2 are connected together to a source of bias potential represented by $V_{GG}$. Various other possible circuit arrangements are suitable for use of the structure in accordance with this invention. The source of bias potential $V_{GG}$ completes the clamping circuit branch for the protective element Q2 in addition to supplying the bias for the gate electrode 18 of Q1. The use of the gate electrode 28 of Q2 is optional. It need not be present or if present not used as it will in most cases be unnecessary to apply a potential thereto for maintaining conductivity through the highly doped p+ region.

Figure 2:
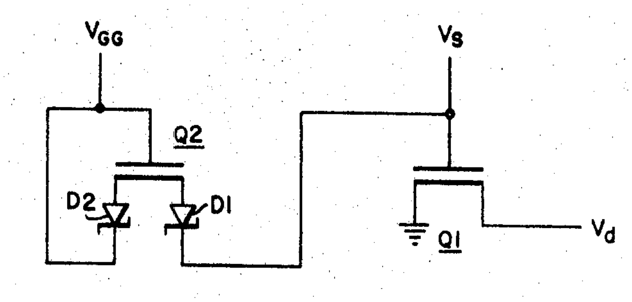
FIG. 2 is an approximate equivalent circuit of the embodiment of FIG. 1.

FIG. 2 illustrates an approximate equivalent circuit of the embodiment of FIG. 1 showing that the source, drain and channel regions 24, 26 and 25 of Q2 effectively form back to back Zener diodes D1 and D2. In operation, for the conductivity type of the structure as illustrated, it being understood that the conductivity types and potential polarities may be reversed from that shown and discussed, if a large positive voltage surge appears at the input and if this voltage is greater than $V_{GG}$ plus $V_D$ plus $V_Z$, where $V_D$ is the forward drop of diode D2 and $V_Z$ is the Zener breakdown voltage of the other diode D1, then diode D1 breaks down, diode D2 is forward biased and the gate of Q1 is clamped to voltage equal to only $V_{GG}+V_D+V_Z$.

On the other hand, if a large negative voltage appears at the input, then diode D2 breaks down, D1 is forward biased and the input is clamped at a voltage equal to $-(V_Z+V_D-V_{GG})$. Thus for either polarity the gate is protected while still permitting effective signal variations from $-(V_Z+V_D-V_{GG})$ to $+(V_{GG}+V_D+V_Z)$. These values may be comfortably less than the breakdown voltage of the insulating layer which is typically about 50 volts or greater for common devices employing silicon dioxide. $V_Z$ for an n+, p+ junction will be as low as 6 volts, $V_D$ will be about 0.7 volt while $V_{GG}$ in many useful applications is about zero volt.

As an additional advantage besides providing a protective element for the MIS device, in this invention the biasing voltage $V_{GG}$ appears at the gate of Q1 and yet maintains a high input impedance to the MIS transistor. This is similar to the principle disclosed by the present inventor and Van Beek in copending application Ser. No. 565,594, filed July 15, 1966, and assigned to the assignee of the present invention which should be referred to for further description of MIS applications requiring high input impedance and the provision of an auxiliary MIS transistor operating in the cutoff region through which gate bias is applied to maintain high input impedance. Here however, the gate of Q2 need not be biased to a negative potential to cut off Q2. Such a negative bias potential would require an extra power supply which is often inconvenient. The additional p+ region 25 makes Q2 an enhancement mode device. Thus the gate 28 of Q2 can be connected to the source 24 as shown without causing Q2 to turn on and reduce the input impedance of Q1. If the surface of the structure is well passivated, minimizing surface charges, the gate electrode may be omitted or not used.

While the present invention has been shown and described in a few forms only, it will be apparent that various modifications may be made without departing from the spirit and scope thereof.

I claim as my invention:

1. An MIS device comprising: a body of semiconductive material having a first region of first conductivity type; source and drain regions of second conductivity type in said first region and defining a channel region therebetween at a surface of said first region; an insulating layer over said channel region having a gate electrode thereon, said insulating layer being subject to voltage breakdown and permanent damage upon application of voltage signals to said gate electrode of a magnitude ($V_B$) to which said gate electrode may be subject during operation; means to ensure the magnitude of voltage across said insulating layer is below $V_B$ comprising a protective element also within said body electrically coupled to said gate electrode and characterized by having a pair of back to back PN junction diodes that clamp any signal applied to said gate electrode to a value below $V_B$; said protective element comprising a second region of said first conductivity type like said first region in thickness and impurity concentration profile; second source and drain regions in said second region like said first-named source and drain regions in thickness and impurity concentration profile; and an additional region between and in P-N junction relation with said second source and drain regions of material of said first conductivity type more highly doped than said second region with one of said second source and drain regions conductively connected to said gate electrode.

2. The subject matter of claim 1 wherein: a source of biasing potential is coupled to the other of said second source and drain regions not connected to said gate electrode.

3. The subject matter of claim 1 wherein: a guard ring region is in said first region surrounding and spaced from said first-named source and drain regions and having projections extending in but not across said channel region and being like said additional region in thickness and impurity profile.

4. The subject matter of claim 3 wherein: a source of biasing potential is coupled to the other of said second source and drain regions not connected to said gate electrode.

References Cited

UNITED STATES PATENTS

| | | | |
|---|---|---|---|
| 3,284,636 | 11/1966 | Talsoe | 307—88.5 |
| 3,286,189 | 11/1966 | Mitchell et al. | 330—18 |
| 3,317,668 | 5/1967 | Johnsen | 178—69 |
| 3,356,858 | 12/1967 | Wanlass | 307—88.5 |

OTHER REFERENCES

"MOS FET for Analog Switching," Electronics, vol. 38, September–October 1965, p. 155.

JOHN W. HUCKERT, Primary Examiner

J. R. SHEWMAKER, Assistant Exaxminer

U.S. Cl. X.R.

307—303, 304; 317—235